(12) United States Patent
Donia et al.

(10) Patent No.: US 10,734,773 B2
(45) Date of Patent: *Aug. 4, 2020

(54) INFRASTRUCTURE FOR MOBILE DEVICES AND ELECTRONIC LOOSE EQUIPMENT

(71) Applicant: INGENIO AEROSPACE INC., Montreal (CA)

(72) Inventors: Daniel Mircea Donia, Dollard-des-Ormeaux (CA); James Edward Bell, Outremont (CA)

(73) Assignee: INGENIO AEROSPACE INC., Montreal (CA)

(*) Notice: Subject to any disclaimer, the term of this patent is extended or adjusted under 35 U.S.C. 154(b) by 0 days.

This patent is subject to a terminal disclaimer.

(21) Appl. No.: 16/460,082

(22) Filed: Jul. 2, 2019

(65) Prior Publication Data

US 2019/0393661 A1 Dec. 26, 2019

Related U.S. Application Data

(63) Continuation of application No. 15/030,217, filed on Apr. 18, 2016, now Pat. No. 10,374,375.

(51) Int. Cl.
*H01R 33/94* (2006.01)
*H02H 3/087* (2006.01)
(Continued)

(52) U.S. Cl.
CPC ....... *H01R 33/94* (2013.01); *B64D 11/00152* (2014.12); *F16M 11/041* (2013.01);
(Continued)

(58) Field of Classification Search
CPC .......... B64D 11/0015; B64D 11/00153; B64D 11/0624; B64D 11/00152; B64D 11/06; B64D 11/0627; B64D 11/0638; F16M 11/10; F16M 11/2014; F16M 13/00; F16M 13/02; F16M 11/041; F16M 11/2064; F16M 11/28; F16M 11/105; F16M 11/14;
(Continued)

(56) References Cited

U.S. PATENT DOCUMENTS

| 5,271,590 A | 12/1993 | Rosen |
| 6,450,828 B1 | 9/2002 | Gordon |

(Continued)

OTHER PUBLICATIONS

PCT/CA2014/051008 international preliminary report on Patentability dated Feb. 25, 2016.
(Continued)

*Primary Examiner* — Edwin A. Leon
*Assistant Examiner* — Matthew T Dzierzynski
(74) *Attorney, Agent, or Firm* — Anglehart et al.

(57) ABSTRACT

A new infrastructure for mobile devices and electronic loose equipment, preferably an aircraft infrastructure, is designed to be deployed for both new production aircraft and the after-market installed base for all parts of the aircraft that have human interaction, such as the galley, cockpit or cabin. The architecture is designed around two main objectives: creating stylized and functional products with flexibility in design and providing reliability and maintainability for operators while integrating power and charging mediums to those devices. This architecture is composed of several elements that as a whole complete our new architecture for mobile devices and electronic loose equipment design.

9 Claims, 6 Drawing Sheets

(51) Int. Cl.
| | |
|---|---|
| H02H 3/20 | (2006.01) |
| G06F 1/16 | (2006.01) |
| G06F 1/26 | (2006.01) |
| H01R 24/62 | (2011.01) |
| H01R 33/74 | (2006.01) |
| H02H 3/00 | (2006.01) |
| H05K 5/02 | (2006.01) |
| H05K 5/00 | (2006.01) |
| F16M 11/04 | (2006.01) |
| F16M 11/10 | (2006.01) |
| F16M 11/14 | (2006.01) |
| F16M 11/20 | (2006.01) |
| F16M 13/00 | (2006.01) |
| H02H 3/06 | (2006.01) |
| B64D 11/00 | (2006.01) |
| H02J 7/00 | (2006.01) |

(52) U.S. Cl.
CPC ............ *F16M 11/10* (2013.01); *F16M 11/14* (2013.01); *F16M 11/2014* (2013.01); *F16M 11/2021* (2013.01); *F16M 11/2078* (2013.01); *F16M 13/00* (2013.01); *G06F 1/1632* (2013.01); *G06F 1/1633* (2013.01); *G06F 1/26* (2013.01); *H01R 24/62* (2013.01); *H01R 33/74* (2013.01); *H02H 3/003* (2013.01); *H02H 3/06* (2013.01); *H02H 3/087* (2013.01); *H02H 3/202* (2013.01); *H02J 7/00* (2013.01); *H05K 5/0204* (2013.01); *H02J 7/0044* (2013.01); *H05K 5/0017* (2013.01)

(58) Field of Classification Search
CPC ............ F16M 11/2021; F16M 13/022; F16M 2200/02; F16M 2200/022; F16M 2200/027; F16M 2200/065; F16M 2200/08; F16M 11/04; F16M 11/126; F16M 11/18; F16M 11/2007; F16M 11/2078; F16M 11/2092; F16M 11/22; F16M 11/24; F16M 11/40; F16M 2200/041; F16M 2200/044; F16M 2200/048; B60R 11/0235; B60R 2011/0087; B60R 11/0252; B60R 2011/0084; B60R 2011/0082; B60R 2011/0017; B60R 2011/0085; B60R 2011/0007; B60R 2011/0012; B60R 2011/0014; B60R 2011/0029; B60R 2011/0078; B60R 2011/008; B60R 7/04; B60R 11/02; B60R 11/0241; B60R 11/0264; B60R 2011/0003; B60R 2011/0005; B60R 2011/0015; B60R 2011/0061; B60R 2011/0066; B60R 2011/0075; B60R 2011/0089; B60R 2011/0091; B60R 2011/0094; Y10S 248/917; Y10S 248/921; Y10S 224/929; Y10S 248/919; Y10S 248/923; H01R 13/627; H01R 35/00; H01R 13/633; H01R 2201/06; H01R 43/26; H01R 13/6666; H01R 13/2421; H01R 13/518; H01R 13/625; H01R 13/62933; H01R 13/68; H01R 13/7175; H01R 13/73; H01R 2107/00; H01R 2201/26; H01R 24/62; H01R 27/02; H01R 33/74; H01R 33/94; H01R 35/02; G06F 1/1632; G06F 1/1601; G06F 1/1626; G06F 1/1633; G06F 1/26; G06F 2200/1612; G06F 2200/1633; G06F 2200/1634; G06F 2200/1639; B60N 2/468; B60N 3/00; B60N 3/001; H04N 5/64; H05K 5/0204; H05K 5/0017; Y10T 29/49826; Y10T 16/5453; Y10T 16/546; Y10T 292/385; Y10T 292/426
See application file for complete search history.

(56) References Cited

U.S. PATENT DOCUMENTS

| | | |
|---|---|---|
| 6,666,704 B2 | 12/2003 | Rodney, Sr. |
| 7,121,514 B2 | 10/2006 | Twyford |
| 7,708,240 B2 | 5/2010 | Homer et al. |
| 8,523,130 B2 | 9/2013 | Westerink |
| 8,734,186 B2 | 5/2014 | Panko et al. |
| 8,746,456 B1 | 6/2014 | Camarillo |
| 8,982,578 B2 | 3/2015 | Bryan et al. |
| 9,045,096 B2 | 6/2015 | Procter et al. |
| 9,107,325 B1 | 8/2015 | Ihn et al. |
| 9,201,453 B2 | 12/2015 | Stanley |
| 9,278,648 B2 | 3/2016 | Ackeret et al. |
| 9,527,456 B2 | 12/2016 | Ackeret et al. |
| 2002/0014944 A1 | 2/2002 | Dinsmore |
| 2002/0066392 A1 | 6/2002 | Calam et al. |
| 2009/0224122 A1 | 9/2009 | Liao |
| 2010/0277892 A1 | 11/2010 | Konopelko et al. |
| 2011/0007491 A1 | 1/2011 | Robinson et al. |
| 2011/0147560 A1 | 6/2011 | Camarillo |
| 2011/0261273 A1 | 10/2011 | Weaver |
| 2012/0087069 A1 | 4/2012 | Fu et al. |
| 2012/0206867 A1 | 8/2012 | Pence |

OTHER PUBLICATIONS

PCT/CA2014/051008 international search report dated Feb. 20, 2015.
PCT/CA2014/051008 search strategy dated Feb. 20, 2015.
PCT/CA2014/051008 written opinion dated Feb. 20, 2015.
Canadian application 2927670 dated May 17, 2016.

INFRASTRUCTURE FOR MOBILE DEVICES AND ELECTRONIC LOOSE EQUIPMENT

This application is a continuation patent application of U.S. patent application Ser. No. 15/030,217 that claims priority from U.S. provisional patent application Ser. No. 61/892,721, filed Oct. 18, 2013.

TECHNICAL FIELD

This invention relates to the infrastructure for mobile devices and electronic loose equipment. More specifically, it relates to the infrastructure for aircrafts, trains, cars or ships.

BACKGROUND

Mobile devices are driving a major technological revolution that is spreading across all facets of human activity from daily life to the work place. Along with the deployment of Wi-Fi and wireless capability onboard aircraft many users and clients are bringing tablets, smartphones or other gadgets onboard. There is a need to address the portability of these technologies inside the aircraft. Therefore, provide options to the different clients and users to bring the electronic loose equipment onboard and place them on arms, holders, or other mechanisms for storage, use or for charging.

SUMMARY

It is an object of the present invention to provide a new infrastructure for mobile devices and electronic loose equipment, preferably an aircraft infrastructure designed to be deployed for both new production aircraft and the aftermarket installed base. This invention's scope reaches all parts of the aircraft that have human interaction, such as the galley, cockpit or cabin.

This new architecture is designed around two main objectives: creating stylized and functional products with flexibility in design and providing reliability and maintainability for operators while integrating power and charging mediums to those devices. This architecture is composed of several elements that as a whole complete our new architecture for mobile devices and electronic loose equipment design.

These elements are: a power charger, a receptacle, an arm, a connector and a holding plate.

The aircraft infrastructure for mobile devices and electronic loose equipment is designed to provide universal pairing with the existing mobile devices and tablets and also leaves the door open to adapt new developments in this sector. It provides maintainability and arm placement in aircrafts of all types, also relevant to various sectors (new production or used/after-market) as well as in different locations of the aircraft.

One of the main elements of said aircraft infrastructure is its interchangeability. This feature is defined as that quality that allows a part to substitute or be substituted by other component parts, and be installed by the application of the attaching means only (bolts, nuts, screws, washers, pins, etc.). This definition specifically precludes the use of trimming, cutting, filing, drilling, shimming, and forming during installation. A set of building blocks is proposed to accommodate different needs of tablet and device functionality inside an aircraft, by providing elements that in between them are interchangeable.

Accordingly, in some embodiments, there is provided an aircraft device mounting system having at least one type of quick-release mechanical and electrical coupling with complementary male and female portions, an aircraft body mountable unit having a mounting flange, one of the male and female portions, and a power supply connectable to an aircraft power bus and configured to provide lower voltage power, preferably with resettable electronic fuse protection, to the one of the male and female portions, a support arm having two of the male and female portions, a tablet computer holder having one of the male and female portions, wherein the support arm is connectable between the aircraft body mountable unit and the table computer holder.

Another problem that can arise with mountings secured permanently to an aircraft interior for receiving a removable bracket, arm or device is that the removable portion can be hit or subjected to forces that could damage the portion of the aircraft body to which the mounting is secured. This problem can be solved by providing a portion of the removable device that will break under such extreme force, also called herein a mechanical fuse, thus sparing the mounting that is permanently secured to the aircraft body. In some cases, this portion can be a breakable biscuit that is received by a complementary socket of the mounting.

In some embodiments, there is provided an aircraft socket for fixed mounting to an aircraft cabin body component and for receiving and mechanically supporting a removable support arm comprising or for supporting an electrical or electronic device, the socket comprising a flange for mounting to said aircraft cabin body component, a rim for engaging and securely supporting a complementary rim of said support arm, a receptacle for receiving and securing a male insert of the support arm, the receptacle spanning a full width of the socket inside the rim, an electrical connector within the rim and located to a side of the receptacle for connecting with a complementary electrical connector of the support arm, and power control circuitry connectable to an aircraft power supply bus and configured to provide electrical power to the electrical connector. The rim can be circular, oval, square, rectangular or any desired polygon in shape. The male insert can be provided within the rim such that one side of the insert is on a diameter or mid-line of the rim, with the electrical connector, for example a USB connector, provided within the rim opposite the insert receptacle. If desired, the male insert can be beveled or shaped to fit within the rim shape.

Definition, Terms, Elements

Aircraft: any machine capable of flying by means of buoyancy or aerodynamic forces, such as a glider, helicopter, or airplane.

Charger: power supply that transforms a certain voltage into another voltage value.

Receptacle: mechanical structure used to support another part by providing physical support or also a bridge for electrical power.

USB: is a technology industry standard developed in the mid-1990s that defines the cables, connectors and communications protocols used in a bus for connection, communication, and power supply between computers and electronic devices.

Cat 5 Ethernet Cable: is a twisted pair cable for carrying signals. This type of cable is used in structured cabling for computer networks such as Ethernet.

USB Extender: it is an electronic device with the sole functionality of repeating the signal (data) from the sender side and transmitting it to the receiver side without the loss of information or quality of data.

BRIEF DESCRIPTION OF THE DRAWINGS

The invention will be better understood by way of the following detailed description of embodiments of the invention with reference to the appended drawings, in which.

DETAILED DESCRIPTION

Figure 1:
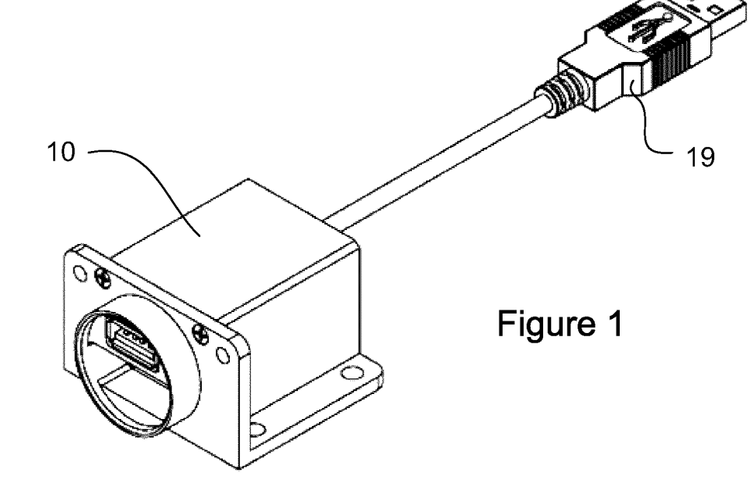
FIG. 1 shows an oblique view of a receptacle part of a mechanical and electrical coupling according to a first embodiment.
Figure 2A:
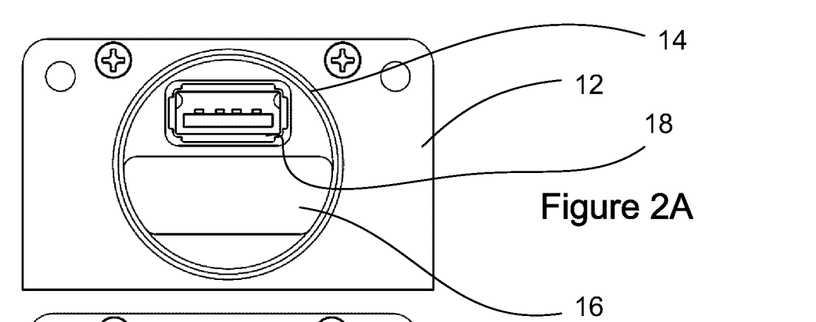
FIG. 2A shows a front view of the receptacle of FIG. 1.
Figure 2B:
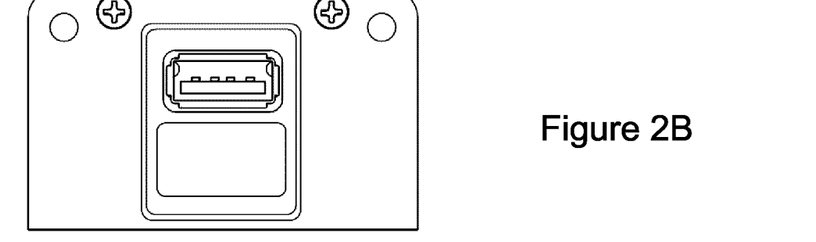
FIG. 2B shows a variant of FIG. 2A in which the receptacle has a square support rim.
Figure 2C:
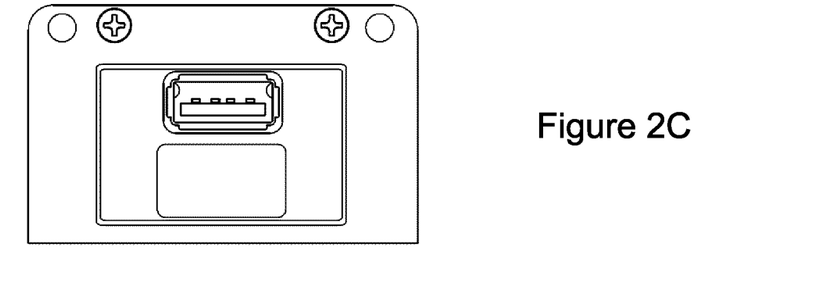
FIG. 2C shows a variant of FIG. 2A in which the receptacle has a rectangular support rim.

Referring to FIG. 1, there is shown a quick-release mechanical and electrical coupling female portion 10. As also seen in FIG. 2A, the female portion 10 is an aircraft body mountable unit that has a mounting flange 12 for fastening to a panel of the aircraft, such as a wall, seat-back, armrest or the like. A rim 14 is circular in FIG. 2A and rectangular in FIG. 2B. The rim may protrude through a hole in a panel to which the unit 10 is mounted from the rear, or the unit can be surface mounted. As illustrated, the unit 10 can have fastening holes on a front face and on a side for accommodating different mounting configurations, and it will be understood that different fastening arrangements can be implemented.

Figure 3:
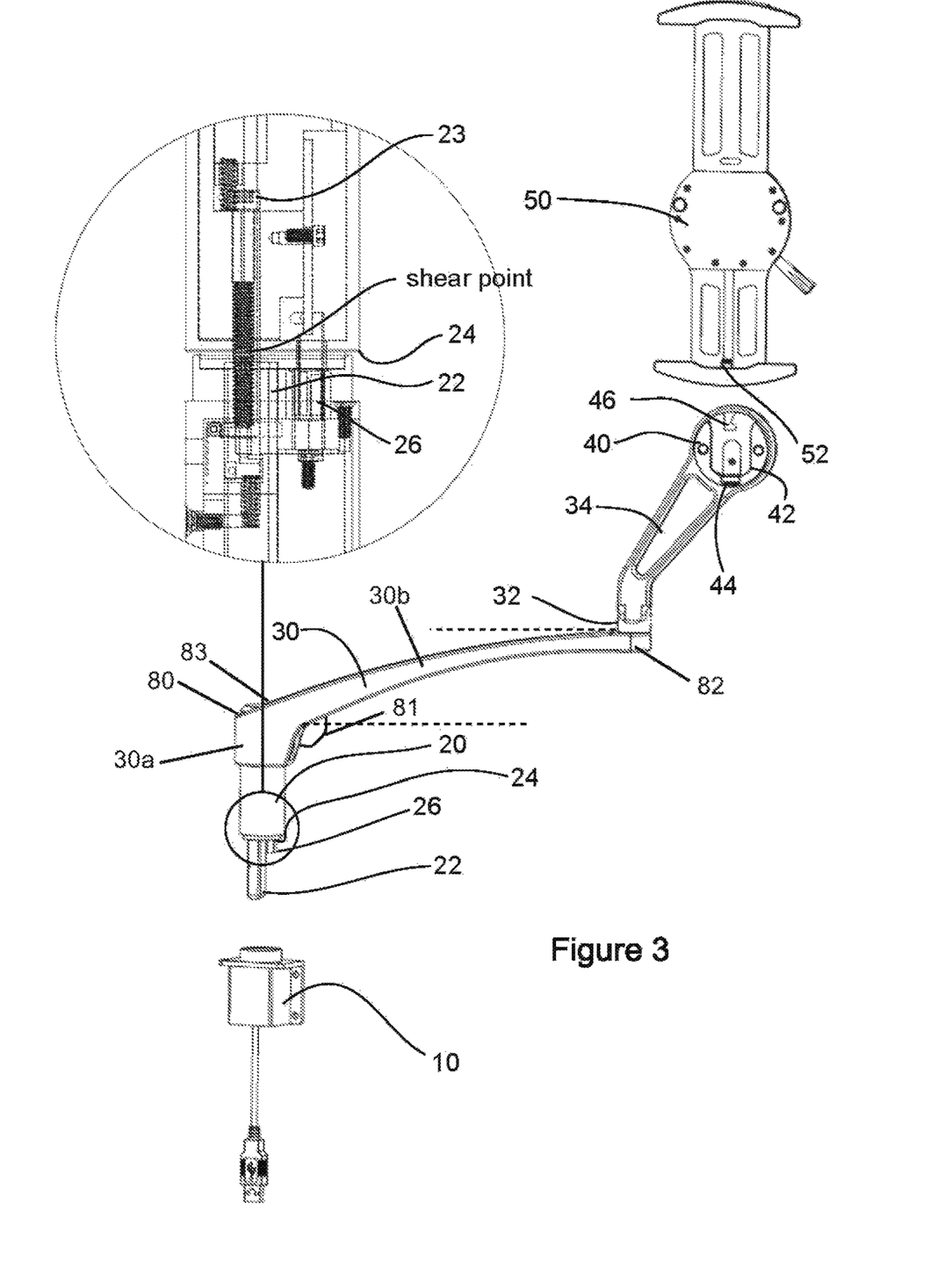
FIG. 3 shows the receptacle of FIG. 1 with a support arm and device holder according to one embodiment, in which the support arm has at a base end a male portion complementary to the receptacle and at another end a universal coupler female portion, and the device holder is connectable to the universal coupler, the figure including an magnified transparent view detail of the mechanical fuse.

A slot 16 is provided in the unit 10 that receives a corresponding male biscuit 22 of a male portion 20 (shown in FIG. 3). The slot 16 can be covered by a flap that can be biased t be closed when not in use. An electrical or a combined electrical and data connector 18 is provided in the unit 12, and is shown in FIG. 2A to be a female USB connector. The type and gender of the connector can vary depending on the application.

The USB female connector 18 in FIGS. 1 and 2A are connected to a male USB plug 18 that in turn is connected to a power supply circuit as will be described with reference to FIGS. 9 and 10, that is housed in a housing not shown. It will be appreciated that the power supply circuit can be housed within the unit 10, if desired.

As shown in FIG. 3, an arm 30 has the male portion 20 connected to its lower end, and a universal coupling member 40 connected to its upper end. As seen in FIG. 3, the arm has a first segment 30a and a second segment 30b. The first segment 30a and the second segment 30b form an elbow 80. As shown in FIG. 3, the elbow 80 has a fixed angle 81 that is greater than 90 degrees, where the second segment 30b is upwardly curved, such that the first end 82 of the second segment 30b is higher than the second end 83 of the second segment 30b. The male portion 20 has a corresponding rim 24 for contacting rim 14, a biscuit 22 for inserting into slot 16 and a male USB connector 26 for connecting to the female connector 18. As shown in the detail, the biscuit 22 can be made of metal, such as aluminum or a die-cast metal, or any other suitable material that is able to support normal use forces applied to the coupling 20,10. The biscuit 22 is connected to the male portion 20 by a shear screw 23 that will break when arm 30 is subjected to a large force, for example a weight of about 200 pounds (900 N) at the end of the arm 30. In this way, an excessive force breaks the shear screw 23 in the biscuit 22 to protect the aircraft body connected to the unit 10 from damage. This protection is called a mechanical fuse.

While not shown in FIG. 3, the coupling 20 can comprise, for example, a push button in the middle of the joint between arm 30 and coupling 20 for actuating a release for a latch mechanism that operates to lock the male member 22 within the slot 16. In this way, the arm 30 can be held not only by the friction between the biscuit 22 and the slot 18, along with gravity, but also using a latch or locking mechanism.

The arm 30 also supports in the embodiment illustrated in FIG. 3 a rotation and pivot joint 32 for adjusting an orientation of the segment 34 carrying member 40.

The universal coupling female member 40 has a slot 42, electrical connector 44, and locking recess 46. The tablet holder 50 has a tablet power connector (e.g. USB micro, USB mini, Lightning, etc.) 52, and a complementary male universal connector as better shown in FIG. 4.

While providing electric power is important, it will be understood that the connectors are designed to be able to provide power and data. Data connectivity between connected devices and the aircraft is optional, but can be desirable for a variety of applications. In some embodiments, it is contemplated to have a charging circuit adapt aircraft bus power to suitable low voltage power for devices, while a network interface connects the data of the connector 18 or 44 to an aircraft data network bus for the intended purpose of device connectivity. Such circuits can be housed with a housing of unit 10.

Figure 4:
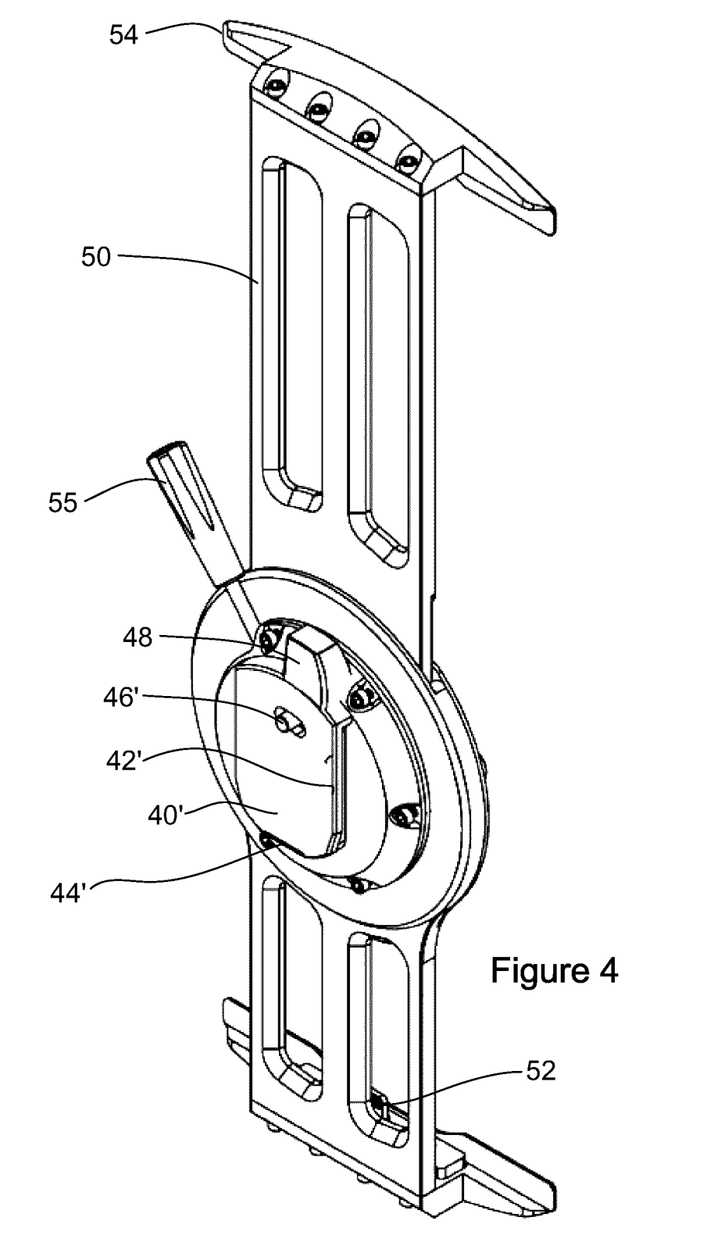
FIG. 4 shows an oblique rear view of the device holder according to the embodiment of FIG. 3.

The rear of the tablet holder 50, as shown in FIG. 4, has a top and bottom bracket 54 for engaging and holding a tablet computer from opposed sides or ends, and a lever 55 for controlling a separation of the brackets 54 to grip the tablet. The upper portion of the holding plate 50 moves while the lower portion is fixed, and it will be appreciated that a variety of mechanical arrangement can be used to secure the tablet to the holding plate 50. For example, the upper portion can be simply biased to grip the tablet.

The male portion 40' of the universal coupling 40/40' has a flange 42' for engaging with the slot 42, an electrical connector 44' for connecting to the connector 44, and a locking tab 46' for engaging the locking recess 46. The connector 44 is connected to the coupling 52 by conductors integrated with the holder 50. Release of the locking tab 46' can be done using release tab 48 that can be used to move the tab 46' against the action of a spring. It will be appreciated that other quick release mechanisms can be used for locking and unlocking the portions 40 and 40' from one another.

Figure 5:
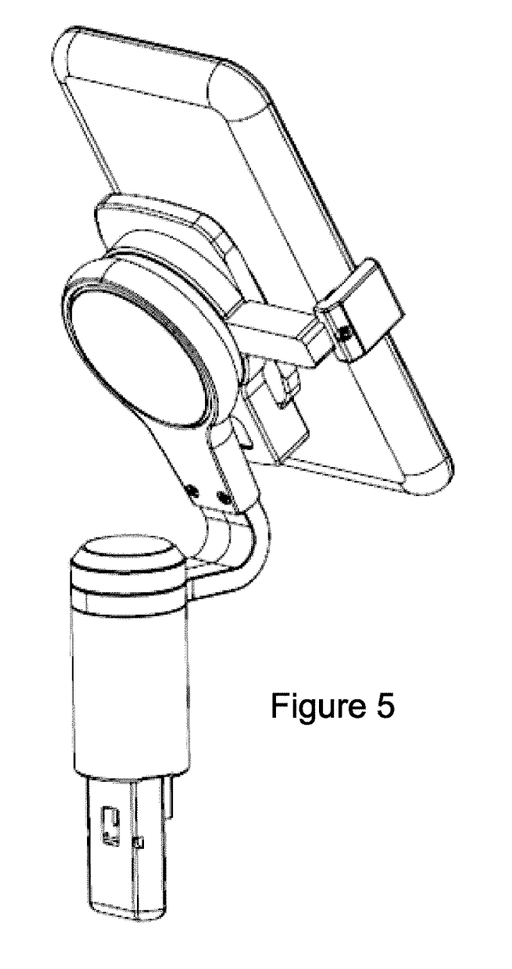
FIG. 5 shows an oblique view of a small arm and a holder for a handheld smartphone device.
Figure 6:
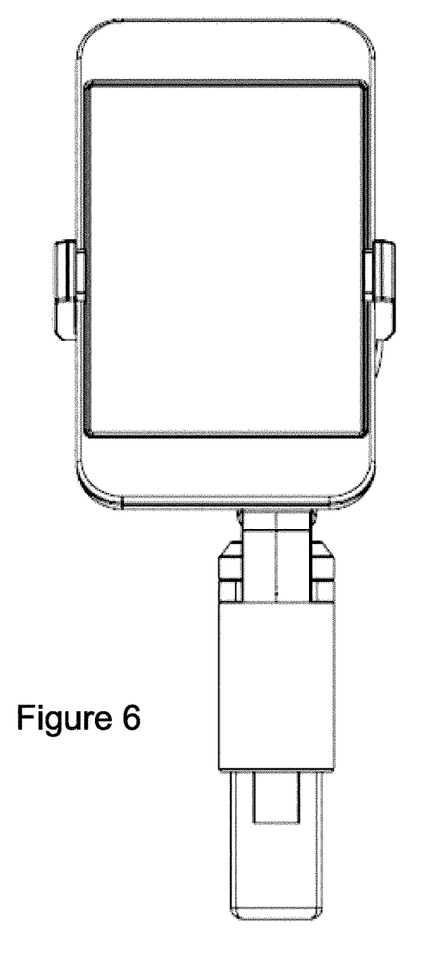
FIG. 6 shows a front view of the small arm and a holder for a handheld smartphone device of FIG. 5.

While the arm 30 provides an ability to position and orient a tablet device with a radius of movement of about 40 cm, it will be understood that the arm can take a variety of forms and functions. For example, the arm 30 can be much smaller and provide no or only one degree of freedom for supporting a smartphone-size holder 50' as illustrated in FIGS. 5 and 6. Such a smaller device holder 50' may provide only a base with connector 52 and a support for holding the smartphone or small tablet inclined or vertically for viewing by a passenger, crew member or pilot.

Alternatively, the arm 30 of FIG. 3 can provide more degrees of freedom to provide height adjustability. While the arm 30 is illustrated as having portion 40 of a universal connector at its end, it will be appreciated that it may directly have its desired holder or device at its end. For example, the arm 30 can comprise a reading light built in. Alternatively, a reading light can use a coupling portion 40' to connect to an arm 30 having coupling portion 40. While the arm 30 is shown to have different coupling types at each end, it will be appreciated that the arm 30 can have the same type of couplings at both ends, as in the embodiment of FIG. 8.

Figures 7, 8:
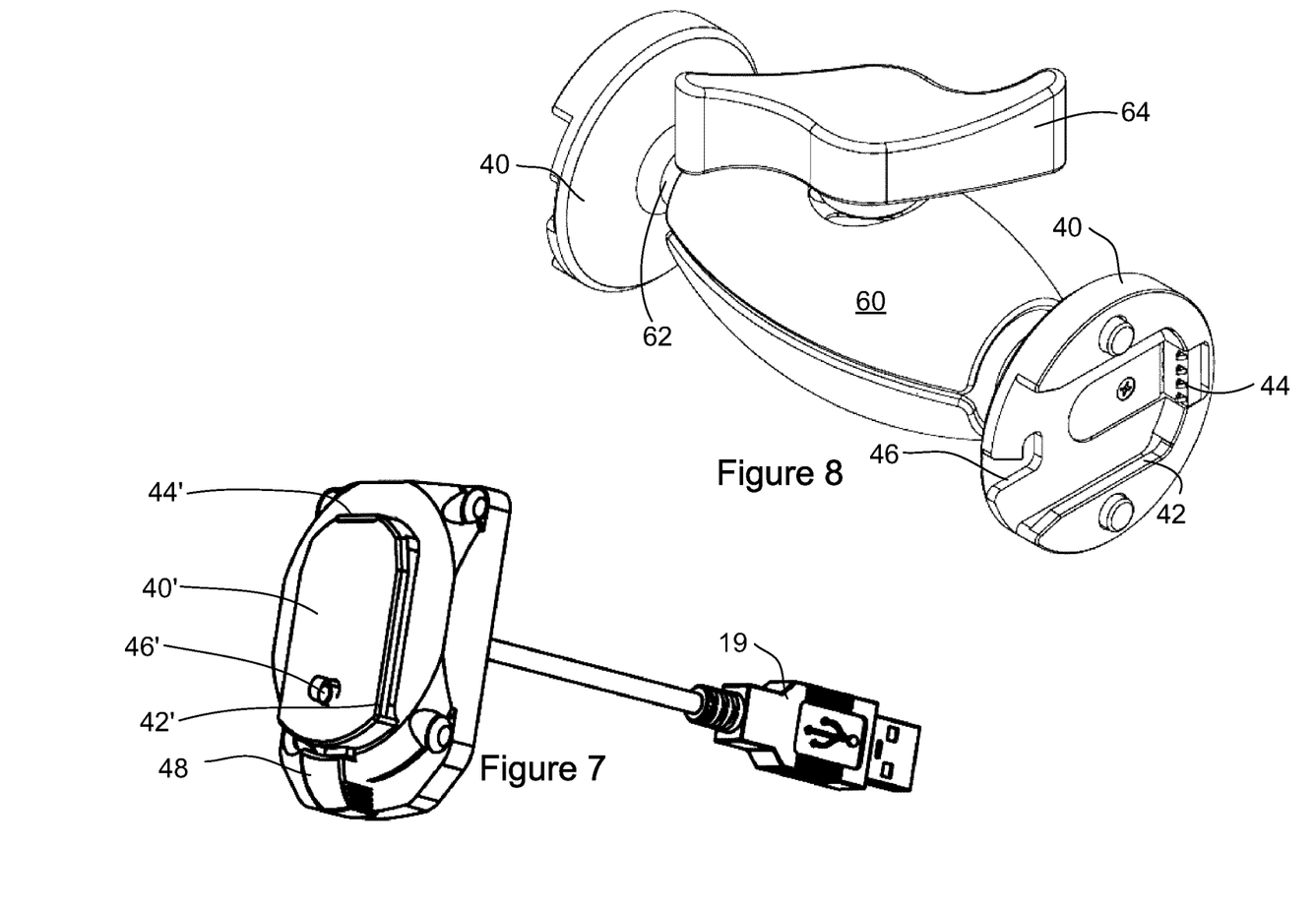
FIG. 7 shows an oblique view of a cockpit console mountable male portion of the universal coupling.
FIG. 8 shows an oblique view of a cockpit support arm connectable between the console mountable universal coupling male portion of FIG. 7 and the male portion of the universal coupling of the device holder of FIG. 4, the cockpit support arm having two adjustable and lockable universal joints for adjusting the device holder within a cockpit.

FIG. 7 shows the male universal coupling portion 40' arranged as a cockpit console or panel mountable unit. This is a surface mounted unit that is fastened to the outer surface of a panel (e.g. using fastener holes as shown). The unit 40' can have the same function as described with reference to FIG. 4, namely locking tab 46', release 48, connector 44' and flange 42'. The unit 40' can be connected to a USB charger circuit via connector 19. The unit 40' can use a proprietary electrical connector 44' to connect to the complementary connector 44 (shown in FIG. 8), or a standard connector, such as mini-USB or Lightning.

In the tight confines of a cockpit, the support arm 60, as shown in FIG. 8, is shorter than for the cabin, and has two universal ball joints 62 locked in position with a certain resistance to force by a mechanism 64, as for example a screw clamp, each joint 62 being connected to a respective a female coupling portion 40. One female coupling portion 40 is for connecting to the cockpit mounted unit, and another is for connecting to the tablet holder 50 as illustrated in FIG. 4. Once a tablet is mounted onto the holder 50, its position and orientation can be adjusted with the clamp handle 64 turned to free the joints 62, and once in the desired position and orientation, the clamp is tightened.

Figure 9:
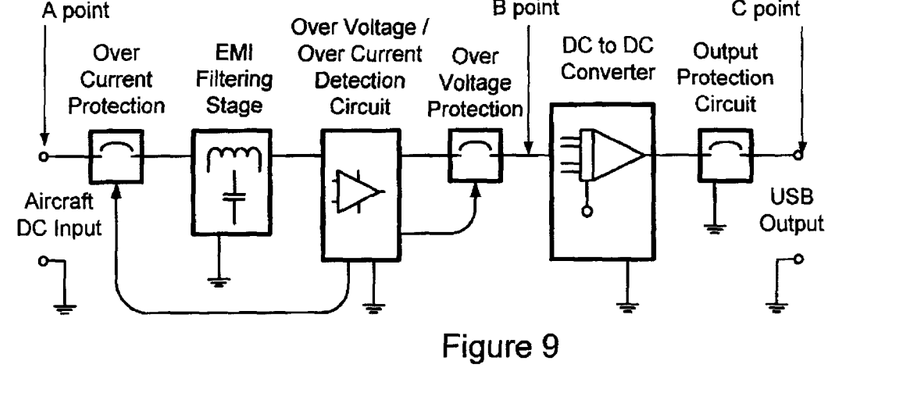
FIG. 9 is a schematic block diagram of a power supply circuit.

FIG. 9 illustrates a schematic block diagram of the power supply circuit 70 that comprises an over current protection circuit 71 connected to an aircraft DC input, an EMI filter 72 connected to the protection circuit 71, a detection circuit 74 connected to the filter 72 that detects voltage and current coming from the aircraft bus and controls the circuit 71 and an overvoltage protection circuit 75. The output of the circuit 75 feeds a DC to DC converter 76 that provides the desired low DC voltage to an output protection circuit 77 that is then connected to the device connector, such as the USB power bus.

Figure 10:
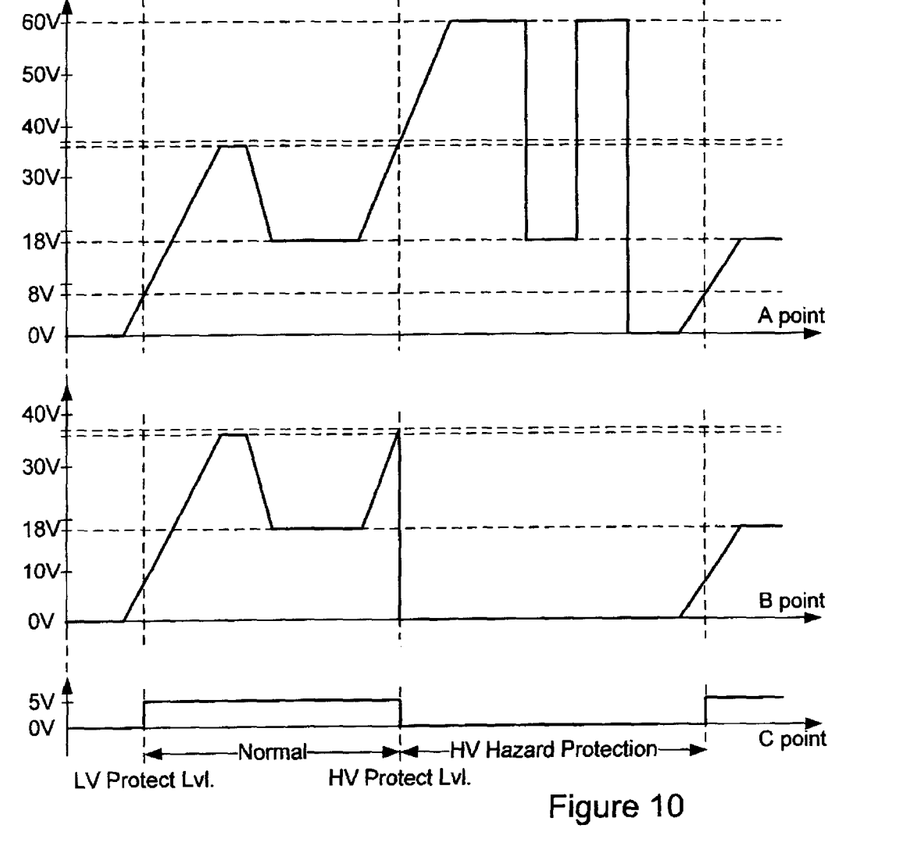
FIG. 10 illustrates normal and protection voltages at three points in the circuit of FIG. 9.

As shown in FIG. 10, the power supply circuit 70 operates to protect against voltage surges on the aircraft bus, for example as may be caused by an excess of voltage generated by the generator. When the voltage is detected to be over a threshold, for example 50 V, then circuit 74 causes device 75 to open and interrupt the supply of current to converter 76. Likewise, when the aircraft voltage is too low, the circuit 74 disconnects power from the converter 76 until a stable power level of at least about 8 V is present on the bus. Circuit 74 also measures the current flow into the converter 76, and if it is above a given threshold, circuit 71 can be controlled to interrupt the supply of current to the filter 72. Filter 72 absorbs small current and voltage spikes, but cannot handle large spikes or fluctuations in power that last, for example, a few seconds.

The circuit 70 can include a functionality LED indicator connected to an output of the converter circuit 76. This indicator is shown in FIG. 9 as a dot in the block for converter 76. It can inform the user that power is not available due to a short in the arm or holder, or in the device. It will be appreciated that the source of the indicator signal can be from a different circuit component than converter 76.

If a device connected to the low voltage output of the converter 76 should draw too much current, for example due to a short, the output protection circuit 77 measures this current level and interrupts power to the device. The circuit 77 can repeatedly try to deliver current to the device, as long as the continuous power supplied is very low, in order to limit the power delivered to a device in case of a malfunction, and in order to prevent damage to the device and to draw less power. This behavior can be considered to be an intelligent fuse in that it allows for power to restore itself as soon as the problem is not longer present. If a device, such as a laptop, is connected into the power supply through, for example, the USB port, and the device supplies power to the power supply 70, the presence of such power can be detected and cause the power supply to disconnect from the device. This disconnection need not impair connect of data to a network of the aircraft. Power supply 70 also provides protection both on the high voltage aircraft bus side and on the low voltage device side.

It will be appreciated that the power supply circuit can be used to power a single connector, such as a USB port, with or without data connectivity, without being associated with a mechanical coupling as described above with reference to FIGS. 1 to 8.

The power charger 70 operates under a fast charge capability. It can utilize a maximum output current of 2.5 A under 5V. It can be housed as a single unit providing all the functionality needed to deliver current to a tablet or a mobile device. It is compact, lightweight and uniquely versatile for an easy installation. It can incorporate an LED, a connector, and perform at high power efficiency.

The charger circuit 70 can be compatible with most tablets (Apple, Android) and all other PED devices that are present in the current market or will be developed in the future.

The charger can also meet the DO-160 certification. This is the official Aviation industry standard required for power units to be placed in cockpits and cabins of various aircraft types.

One very important differentiation between the power charger 70 of the present embodiment and other power charges in the market is the fact that charger 70 provides over current/over voltage protection, bi-directional and reversible voltage protection, automatically resets in the event of a fault, and it can work at a nominal and surge input voltage: 28 VDC/36 VDC.

Depending on what is the use of the charger 70, the applicant has created 2 types of them. In one version, the charger is a device that operates in short distances from the power or data source. Though in airplanes, sometimes the luxury of having the main cabin power or green power is not easy to obtain, the applicant also created an extended version of the charger that can support long distances.

Referring to FIGS. 1, 2A and 2B FIG. 7, the USB Receptacle shown incorporates an all-encompassing type design that seamlessly connects to the arms, holders or other functional devices. The unit 10 is designed to fit in multiple places to create flexibility in placement (ex; cabin, cockpit, side ledges, seats, divans, etc.). It also provides for easy installation with the different elements of the new cabin architecture for mobile devices and loose electronic equipment.

The receptacle 10 can also include a sliding cover (not shown) over the USB connector 18 to protect it when not in use. It is the base mechanical unit to attach all the arms, holders, or other approved products, specifically, those that conform to the support structure for the tablets or electronic devices attached to the cabin architecture.

FIG. 8A wide variety of designs for the arms can be contemplated. These arms can be designed to support aerospace requirements in terms of weight, maintainability and life cycle durability. They can be highly stylized tablet-arms that are designed to be sleek, stylized, visually appealing while they try to blend with the interior of the aircraft minimizing any visual interference. They can be ergonomically designed for optimal viewing when passengers are seated in either an erect or reclined viewing position in the cabin or the aircraft. These can be placed in various locations and configurations as long as the receptacle is present as the base or foundation.

The arms have been developed using a robust design that can accommodate different tablet formats and shapes. They are designed and engineered with a focus on strength, maintainability and reliability. They can provide multiple degrees of freedom to achieve optimal viewing positions (Field Of View) for the seated occupant and by means of a connector they can support any holding plate uniquely fitted to each tablet type.

The arms can also mitigate against vibration-induced white noise.

It is important to specify that the arms can come in different shapes, and these shapes can depend on the desired use and placement of the unit. The arms can be long, short, curved or flat depending on the device that they will be supporting and the nature of its functionality.

The tablet-arm 30 is ergonomically designed to provide the user with a comfortable viewing position both in erect or reclined positions. The design incorporates movement and rotation that balances robustness with efficient maneuverability to effectively optimize the arm usage. The arm can be very robust and designed to meet or exceed typical usage in the cabin while being lightweight.

Referring to FIGS. 7 and 8, the universal coupling 40,40' provides a section of the aircraft infrastructure for mobile devices and electronic loose equipment. This equipment is unique and it provides a locking mechanism 46, 46' to fit a holding plate 40 with an arm or holder. It has several key features and technologies that provide a robust latch while engaged and an easy removal while disengaged.

To latch or secure part 40 to part 40', part 40 needs to be slid inside part 40'. This is simple and almost effortless. After insertion, the mechanism will "latch" or engage, and part 40 will be locked inside part 40'. This will couple the holding plate 40' with the arm 60.

To release part 40', a mechanical lever 48 is pressed or pushed. Pressing this lever will disengage the mechanical system and will "unlatch" the coupling, afterwards, a simple push will release and disengage the unit.

Referring to FIG. 4, the aircraft infrastructure for mobile devices and electronic loose equipment is designed to accommodate different tablet formats. Our design is unique in the industry as it can employ tablet specific interchangeable holding-plates that optimize the fit for each electronic device, create a stable housing to minimize vibration (hence cabin noise) and provide safe stable platform. The tablet can be inserted into the holding-plate 50 and mechanically secured with an advanced locking device (lever 55). Each holding-plate 50 can contain the charging port 52 for the specific device. This component of the tablet-arm assembly can be made of high-grade aluminum to ensure robustness, thereby optimally accommodating wear and tear from constant usage.

The holding-plates 50 can be designed for the most popular tablet devices in the consumer market. For example, this currently includes several generations of the Apple iPad (i.e. 2,3,4), the Apple iPad Mini and the Samsung Galaxy Tab.

The holding plate 50 can be coupled with any arm or holder thanks to the connector 40,40'. As new tablet brands and formats are introduced to the marketplace, the holding plate 50 will be able to easily accommodate them with minimal changes (i.e. no need to replace arm or receptacle). This will be accomplished by designing a new holding-plate fitted specifically for the new tablet model, which will fit into the tablet-arm without any change to the arm assembly due to the connector. Therefore, the customer will not be restricted when they upgrade tablet devices nor will the arm assembly need replacement.

For operators who still want holding plates that can accommodate multiple devices, the applicant has also developed a universal variant, called the Universal Holding Plate, based on the same principles highlighted before.

What is claimed:

1. An aircraft device mounting system comprising:
    an aircraft body mountable unit comprising one of a male or female portion of a quick-release;
    a support arm having a first end and a second end, and comprising at the first end the other of the male or female portion of the quick-release;
    a computer holder for receiving a computing device, the computer holder connected or connectable to the support arm at the second end of the support, wherein the male portion of the quick-release coupling comprises a biscuit and a breakable fastener located at least partially in the biscuit and connecting the biscuit to a rest of the quick-release coupling, the breakable fastener acting as a mechanical fuse by breaking under excessive force.

2. The system as defined in claim 1, further comprising a power supply circuit wherein the power supply circuit comprises automatically resettable electronic fuse protection.

3. The system as defined in claim 2, wherein the power supply circuit is configured to protect against over-voltage on the aircraft bus side and to protect against over-current and reverse-voltage on a device side.

4. The system as defined in claim 1, wherein the system comprises a flange and slot coupling.

5. The system as defined in claim 1, wherein the quick-release coupling comprises a plug and socket coupling.

6. The system as defined in claim 5, wherein the male portion of the plug and socket coupling is spaced from an electrical connector.

7. The system as defined in claim 5, wherein the female portion of the plug and socket coupling comprises a rim configured to extend from a surface of the aircraft body for engaging and securely supporting a complementary rim of said male portion of the plug and socket coupling.

8. The system as defined in claim 7, wherein said rim is circular.

9. The system as defined in claim 7, wherein said rim is rectangular.

\* \* \* \* \*